United States Patent [19]

Camplan et al.

[11] 4,236,097
[45] Nov. 25, 1980

[54] ION SOURCE HAVING FLUID-COOLED SUPPLY CONDUCTORS

[75] Inventors: Jean Camplan, Paris; Jacques Chaumont, Fontenay Le Fleury; Robert Meunier, Bonnelles, all of France

[73] Assignee: Agence Nationale de Valorisation de la Recherche (ANVAR), Neuilly-sur-Seine, France

[21] Appl. No.: 963,205

[22] Filed: Nov. 24, 1978

[30] Foreign Application Priority Data

Nov. 28, 1977 [FR] France .............................. 77 35760

[51] Int. Cl.³ ..................... H01J 61/52; H01J 27/26
[52] U.S. Cl. ..................................... 313/37; 313/230
[58] Field of Search ............................ 313/37, 38, 32

[56] References Cited

U.S. PATENT DOCUMENTS 2,424,002 7/1947 Sloan .............................. 313/37 X Primary Examiner—Robert Segal
Attorney, Agent, or Firm—Frishauf, Holtz, Goodman & Woodward

[57] ABSTRACT

Two current supply conductors connected to an emissive filament located within a vacuum enclosure are each constituted by a leak-tight tube formed of material other than a heavy metal which traverses the enclosure wall through a leak-tight bushing, and by a conductor of electrically conductive heavy metal such as copper which is placed inside the leak-tight tube and completely isolated from the vacuum enclosure. This arrangement permits the continued use of heavy metals such as copper for current supply to ion sources without any attendant danger of heavy metal ion formation in the emitted beam.

6 Claims, 1 Drawing Figure

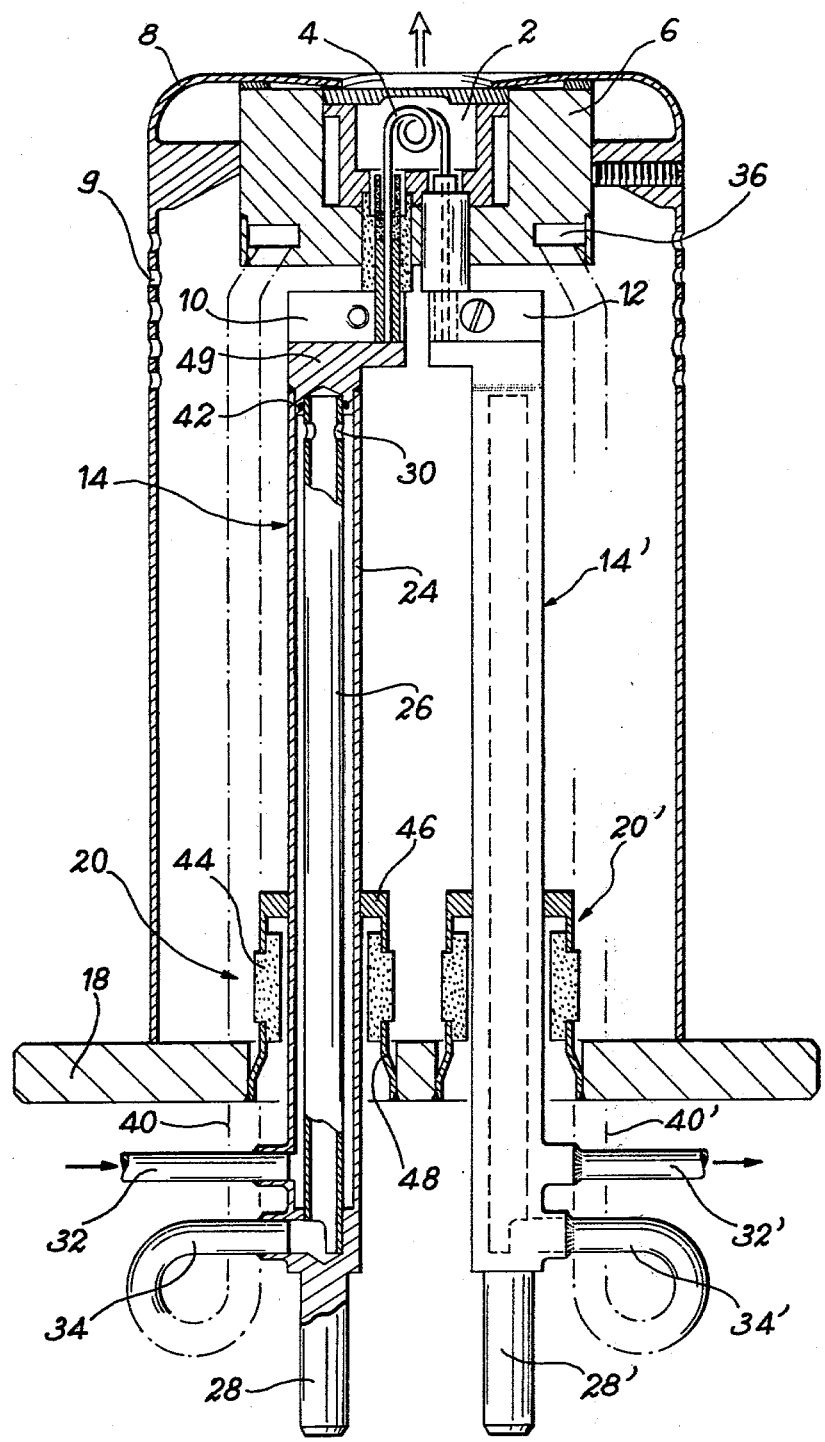

ION SOURCE HAVING FLUID-COOLED SUPPLY CONDUCTORS

This invention relates to an ion source which finds an application especially in the construction of ion implanters which are intended to be employed in the fabrication of semiconductors, for example.

It is known that an ion implanter essentially comprises an ion source, means for extracting and accelerating the ions which are formed, a mass analyzer and means for sweeping a target with the ions. The ion source can be of different types but usually consists of a discharge chamber in which a plasma is maintained by means of an electrical excitation applied from a cathode of helical shape and surrounded by a magnetic confinement field. A suitable gas such as $PF_5$, $BF_3$ or $AsF_3$, for example, is introduced into the chamber. Under the action of the electrical excitation, the gas is ionized and produces ions, the nature of which depends on the gas employed. Relevant information on this subject can be obtained from French Pat. No. 2,064,480 filed on Sept. 15, 1969.

In certain applications and especially in ion implantation into silicon for the fabrication of semiconductors, it is of primary importance to ensure that the ion source does not give rise to any copper or silver ion and more generally to any ion of heavy metals having good conductivity since these metals constitute violent poisons in the case of silicon.

The problem which has therefore arisen consists in forming an ion source which is not subject to this disadvantage. Copper can readily be eliminated from the ionization chamber proper since the cathode is usually of tungsten and the enclosure wall of the chamber is of graphite. This is not possible, however, in the case of the current supply conductors which must permit the passage of 150 amps. Consequently the use of a metal such as copper which has exceptionally good electrical conductivity may not be indispensable but does at least represent a convenient facility which has been widely adopted up to the present time.

The precise aim of the invention is to permit the continued use of copper for current supply conductors while preventing this metal from forming ions in the emitted beam. The invention is accordingly directed to an ion source of the type comprising an emissive filament located within a vacuum enclosure and connected to two current supply conductors. The invention is distinguished by the fact that said supply conductors are each constituted on the one hand by a leak-tight tube formed of material other than a heavy metal and adapted to traverse the enclosure wall through a leak-tight bushing and on the other hand by a conductor of heavy metal and especially copper having good electrical conductivity, said conductor being placed within the interior of the leak-tight tube and being thus completely isolated from the vacuum enclosure.

By virtue of this arrangement in accordance with the invention, the copper employed in the device is isolated from the vacuum enclosure and is consequently not liable to give rise to the formation of any ion within said enclosure.

Although different types of material can be employed in the fabrication of the outer tube, provision is made in an advantageous alternative embodiment for the use of a metal other than copper and silver, and especially stainless steel.

The characteristic features and advantages of the invention will in any case become more readily apparent from the following description of one exemplified embodiment which is given by way of explanation and not in any limiting sense, reference being made to the single accompanying FIGURE which is a diagrammatic sectional view of the ion source in accordance with the invention.

The source shown in the FIGURE comprises a discharge chamber 2 in which is placed a cathode 4 of helical shape, the complete assembly being surrounded by a massive component or body 6. The ends of the cathode 4 are secured to two metallic members 10 and 12 supported by two tubular elements 14 and 14' which traverse a base plate 18 through leak-tight wall-bushings 20 and 20'. During operation, the base plate is fixed on an enclosure (not shown in the FIGURE) which is connected to the implanter.

The massive component 6 and different elements of the ionization chamber are connected to a casing 8 pierced by openings 9 and applied against the base plate 18.

In accordance with the invention, the tubular elements 14 and 14' are constituted on the one hand by a metallic tube 24 of stainles steel, for example, a copper conductor 26 being placed inside said tube. Each outer tube is connected to one of the leak-tight bushings and the end portion 28 (28') is connected to current supply leads (not shown).

Advantageously, the central copper conductor is designed in the form of a tube which defines an annular space with the outer tube 24. A communication is established between said annular space and the internal space of the central tube by means of openings 30 pierced in that end of the tube 26 which is nearest the cathode. These internal spaces can be employed for constituting a circulation system which serves to cool the current supply conductors. In this alternative embodiment, the copper tube 26 serves both as an electrical connection and as a coolant-liquid duct. To this end, provision is made for two pipes 32 and 34 (32' and 34') which are connected to the tubular element 14 (14'). If the massive component 6 is also intended to be cooled, said duct is accordingly pierced by a duct 36 into which a coolant liquid is introduced by means of pipes 40 and 40'. Arrangements are advantageously made for connecting the pipe 34 to the pipe 40 and similarly for connecting the pipe 34' to the pipe 40', with the result that a single cooling circuit is thus constituted between the supply element 14, the duct 36 and the supply element 14'.

The assembly of the complete unit which is illustrated in the FIGURE is particularly straightforward. First of all, a part 49 is employed for securing one end of the inner copper tube 26 to the stainless steel tube 24, for example by means of a brazed silver joint 42. The assembly is then mounted on a leak-tight bushing which comprises a cylinder 44 of electrically insulating material such as glass or alumina and two metallic transition members 46 and 48 of Kovar; the tube 46 is brazed to the stainless steel tube. The assembly is then placed on the base plate 18 and the member 48 is welded to said base plate by means of the argon-arc process, for example.

The filament can be removed without difficulty since it is only necessary to unscrew the members 10 and 12 which support the two ends of the filament.

It will be noted that, in this arrangement, the outer ends of the leak-tight wall-bushings are placed in a vacuum. When these portions are contaminated by metallic deposits formed by the ions emitted by the source, cleaning of these latter does not therefore present any problem. Maintenance of the ion source is consequently facilitated.

Although the ion source which has just been described can be employed in ion implanters of various types, the source can advantageously be employed in the implanter of the particular type disclosed in a patent Application filed by the present Applicant on the same date as the present Application, in respect of "High-current ion implanter". The ion source can clearly be employed in devices other than ion implanters.

What we claim is:

1. An ion source of the type comprising an emissive filament located within a vacuum enclosure and connected to two current supply conductors, wherein said supply conductors are each constituted on the one hand by a leak-tight tube formed of material selected from a group consisting of stainless steel and alloys not substantially heavier than stainless steel and adapted to traverse the enclosure wall through a leaktight bushing and on the other hand by a conductor of heavy metal having good electrical conductivity, each said conductor being connected to said filament through an end-closing plug of said leak-tight tube at the end thereof remote from said bushing and being placed within the interior of the leak-tight tube and being thus completely isolated from the vacuum enclosure.

2. An ion source according to claim 1, wherein the leaktight tube is a metallic tube of a metal other than copper or silver and wherein said conductor within each said leak-tight tube is of copper.

3. An ion source according to claim 1 or claim 2, wherein the inner conductor within each said leak-tight tube is constituted in the form of a tube, an annular zone being formed between said inner conductor tube and said leak-tight tube and adapted to communicate with the internal space of said inner conductor tube by means of at least one orifice, two pipes for the circulation of coolant liquid being connected respectively to said leak-tight tube and to said inner conductor tube.

4. An ion source according to claim 3, wherein the emissive filament is placed within a chamber surrounded by a massive component, said component being pierced by a duct which is connected to two pipes for the circulation of a coolant liquid, said pipes being in turn connected in series to the coolant liquid circulation pipes of the current supply conductors.

5. An ion source according to claim 1, wherein each leak-tight bushing comprises a cylinder of electrically insulating material connected by means of a metallic transition member to a base plate which is rigidly fixed to the enclosure and by means of another metallic transition member to the outer current supply tube, the outer surface of said bushing being placed in a vacuum and the inner surface of said bushing being placed in the surrounding atmosphere.

6. An ion source according to claim 1 or claim 2, wherein each said leak-tight tube is made of stainless steel.

* * * * *